(12) United States Patent
Nishimura et al.

(10) Patent No.: US 6,885,260 B2
(45) Date of Patent: Apr. 26, 2005

(54) FILTER USING FILM BULK ACOUSTIC RESONATOR AND TRANSMISSION/ RECEPTION SWITCH

(75) Inventors: Kosuke Nishimura, Ube (JP); Keigo Nagao, Ube (JP); Chisen Hashimoto, Ube (JP); Eiji Masui, Ube (JP); Hirofumi Kimura, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 8 days.

(21) Appl. No.: 10/476,218

(22) PCT Filed: May 10, 2002

(86) PCT No.: PCT/JP02/04575

§ 371 (c)(1),
(2), (4) Date: Oct. 28, 2003

(87) PCT Pub. No.: WO02/093763

PCT Pub. Date: Nov. 21, 2002

(65) Prior Publication Data

US 2004/0130410 A1 Jul. 8, 2004

(30) Foreign Application Priority Data

May 11, 2001 (JP) ........................................ 2001-141847
Dec. 10, 2001 (JP) ........................................ 2001-375883

(51) Int. Cl.[7] .............................. H03H 9/70; H03H 9/56
(52) U.S. Cl. ..................... 333/133; 333/189; 333/191
(58) Field of Search ............................... 333/186–192, 333/133

(56) References Cited

U.S. PATENT DOCUMENTS 6,081,171 A * 6/2000 Ella .............................. 333/189
6,222,426 B1 * 4/2001 Komazaki et al. ........... 333/133
6,262,637 B1 * 7/2001 Bradley et al. ............... 333/133
6,407,649 B1 * 6/2002 Tikka et al. .................. 333/133
6,472,954 B1 * 10/2002 Ruby et al. ................... 333/133
6,653,913 B1 * 11/2003 Klee et al. .................... 333/188
6,768,396 B1 * 7/2004 Klee et al. .................... 333/187
6,778,038 B1 * 8/2004 Takeishi et al. .............. 333/133

FOREIGN PATENT DOCUMENTS

| JP | 7-307655 A   | 11/1995 |
| JP | 11-88111 A   | 3/1999  |
| JP | 2001-24476 A | 1/2001  |
| JP | 2001-244704 A| 9/2001  |

OTHER PUBLICATIONS

C.W. Seabury et al.; "Thin Film ZnO Based Bulk Acoustic Mode Filters"; 1997 IEEE MTT–S Microwave Symposium Digest; Jun. 1997, vol. 1, pp. 181–184.*

* cited by examiner

*Primary Examiner*—Barbara Summons
(74) *Attorney, Agent, or Firm*—Frommer Lawrence & Haug LLP; Ronald R. Santucci

(57) ABSTRACT

A transmission band filter (110) having a series of elements (111, 113, 115) each composed of a film bulk acoustic resonator and grounded shunt elements (112, 114) each composed of a film bulk acoustic resonator is connected between a transmission port (102) and an antenna port (106). A reception band filter (130) having a series of elements (131, 133, 135) each composed of a film bulk acoustic resonator and grounded shunt elements (132, 134, 136) each composed of a film bulk acoustic resonator is connected between a reception port (104) and the antenna port (106). A film bulk acoustic resonator (150) for adjustment is connected between the antenna port (106) and the ground. The resonance frequency of the adjusting film bulk acoustic resonator (150) lies between the upper limit frequency of the transmission frequency pass band of the transmission band filter (110) and the lower limit frequency of the reception frequency pass band of the reception band filter (130). Therefore a duplexer such that it can be a monolithic element, the power handling capability is good, the size is small, and the cost is low is provided.

25 Claims, 13 Drawing Sheets

FILTER USING FILM BULK ACOUSTIC RESONATOR AND TRANSMISSION/RECEPTION SWITCH

This application is a 371 of PCT/JP02/04575 filed on May 10, 2002, published on Nov. 21, 2002 under publication number WO 02/093763 A1 and claims priority benefits of Japanese Patent Application No. 2001-141847 filed May 11, 2001 and Japanese Patent Application No. 2001-375883 filed Dec. 10, 2001.

TECHNICAL FIELD

The present invention relates to a technical field of a communication apparatus, particularly to a filter and duplexer using a film bulk acoustic resonator.

BACKGROUND ART

There has constantly been a demand for miniaturization in an RF circuit portion of a cellular phone. In recent years, there has been a demand for various functions to be imparted to the cellular phone. To realize this, as many components as possible are preferably incorporated. On the other hand, since a size of the cellular phone is restricted, after all it is necessary to raise a mounting density in an apparatus. Therefore, a demand for reduction of an occupying area (mounting area) and height is strict particularly with respect to the RF circuit portion. Therefore, the occupying area and the height have been requested to be reduced even with respect to the components constituting the RF circuit portion. Moreover, each component has been requested to be constituted of a single part if possible, so that the portion can be manufactured at a low cost. Especially concerning a duplexer or transmission/reception switch which is one of the components constituting the RF circuit portion, sufficient power handling capability is required, and it is necessary not to cause destruction and characteristic deterioration with respect to power supply.

At present, for the duplexer, a ceramic filter or a surface acoustic wave (SAW) filter has been used. The ceramic filter can be monolithic and is inexpensive, but a loss of a resonator is large. To cover this, a dimension of about 23×7×5 mm is required, and the demand for the reduction of the mounting area or height cannot sufficiently be satisfied. On the other hand, the SAW filter is small in size, but has a problem in the power handling capability at a high frequency, and there is a possibility that the filter breaks down, when a surge is generated in an output power of transmission. Moreover, in order to improve characteristics, a circuit also using an electronic switch can also be constituted. However, in this case, the circuit constitution becomes complicated and expensive.

In consideration of these situations, in JP(A) 2001-24476, a duplexer is proposed in which separation between a transmission band and reception band is little, and use in applications such as CDMA-PCS devices requiring a higher power level is possible. The duplexer is constituted of three components including a band filter for transmission, band filter for reception, and 90-degrees phase shifter. A film bulk acoustic resonator (abbreviated as "FBAR") constituting each filter has a very small size and high performance. However, the 90-degrees phase shifter is other than the film bulk acoustic resonator constituting each filter, and is constituted of passive components such as an inductor and capacitor. Therefore, for the duplexer described in the above JP(A) 2001-24476, a plurality of filters and 90-degrees phase shifter need to be mounted on one substrate, and it is difficult to constitute a monolithic structure and to sufficiently reduce the cost. It is also possible to form the 90-degrees phase shifter of the duplexer by a transmission line. However, in this case, a length of at least ten or more millimeters is necessary, a considerably large space is required as compared with the filter, and this constitution is unsuitable for miniaturization. That is, features of the film bulk acoustic resonator suitable for the miniaturization cannot sufficiently be utilized.

Moreover, when the duplexer is used in the above-described application, a pass band width of up to 4% of a central frequency is required in each filter (e.g., when the central frequency is 2 GHz, a pass band width of about 80 MHz is required). However, a piezoelectric material of the film bulk acoustic resonator for use in this application mainly contains AlN and ZnO. In this case, the required pass band width cannot easily be achieved. This is because the pass band width is limited by a piezoelectric coupling coefficient (K2) which is a material parameter. As one method for solving this problem, in JP(A) 2001-244704, it has been proposed that by connection of an external inductor element in series or in parallel to the film bulk acoustic resonator, a broad pass band width be obtained as if an effective K2 of the material increased. However, this method has a defect that the inductor is attached to the film bulk acoustic resonator from the outside and accordingly the whole size of the filter increases.

The present invention has been developed in consideration of the above-described situation, and an object thereof is to provide a duplexer in which a connection portion between a filter for transmission and a filter for reception can be structured to be small in size and which can be formed to be monolithic with the filter for transmission and the filter for reception and which is satisfactory in power handling capability and small in size and inexpensive.

Moreover, the present invention has been developed in consideration of the above-described situation, and an object thereof is to provide a duplexer in which a matching circuit for connecting a filter for transmission using a film bulk acoustic resonator to a filter for reception using the film bulk acoustic resonator or passive elements such as an inductor for obtaining a useful pass band width of each filter are formed to be monolithic with the filters for transmission and reception and which is accordingly small in size and satisfactory in power handling capability and easy to manufacture and can be reduced in cost.

Furthermore, an object of the present invention is to provide a filter for use in the above-described duplexer.

DISCLOSURE OF THE INVENTION

In order to achieve the foregoing object, there is provided a duplexer comprising:

a transmission port, reception port, and transmission/reception port;

a transmission band filter which is connected between the transmission port and transmission/reception port and which includes a first ladder-type circuit including a first series element constituted of a film bulk acoustic resonator and a first shunt element constituted of a film bulk acoustic resonator and which has a transmission frequency pass band; and a reception band filter which is connected between the reception port and transmission/reception port and which includes a second ladder-type circuit including a second series element constituted of a film bulk acoustic resonator and a second shunt element constituted of a film bulk acoustic resonator and which has a reception frequency pass band not overlapped with the transmission frequency pass band, wherein at least one film bulk acoustic resonator for adjustment is connected between the port for transmission/reception and the first and second shunt elements, and a resonance frequency of the film bulk acoustic resonator for adjustment is set between the transmission frequency pass band and the reception frequency pass band.

In an aspect of the present invention, the film bulk acoustic resonator for adjustment is connected between the port for transmission/reception and a ground, and the first and second shunt elements are connected to the ground.

In an aspect of the present invention, the transmission frequency pass band is set to be lower than the reception frequency pass band, and the resonance frequency of the film bulk acoustic resonator for adjustment is set to a value between an upper limit frequency of the transmission frequency pass band and a lower limit frequency of the reception frequency pass band.

In an aspect of the present invention, the transmission band filter includes at least one inductor for enhancing attenuation characteristics on a higher frequency side than the transmission frequency pass band. In an aspect of the present invention, the inductor is connected in parallel with same of the first series elements. In an aspect of the present invention, one end of the inductor is connected to the transmission port.

In an aspect of the present invention, the reception band filter includes at least one capacitor for enhancing attenuation characteristics on a lower frequency side than the reception frequency pass band. In an aspect of the present invention, the capacitor is connected in parallel with some of the second series elements. In an aspect of the present invention, one end of the capacitor is connected to the reception port.

In order to achieve the foregoing object, there is provided a duplexer comprising:

a transmission port, reception port, and transmission/reception port;

a transmission band filter which is connected between the transmission port and transmission/reception port and which includes a first circuit including a first series element constituted of a film bulk acoustic resonator and a first shunt element constituted of a film bulk acoustic resonator and which has a transmission frequency pass band; and a reception band filter which is connected between the reception port and transmission/reception port and which includes a second circuit including a second series element constituted of a film bulk acoustic resonator and a second shunt element constituted of a film bulk acoustic resonator and which has a reception frequency pass band, wherein the transmission port, reception port, transmission/reception port, transmission band filter, and reception band filter are formed using a common substrate, the substrate is a ceramic substrate and includes a patterned conductive film in at least an inner part, and a phase matching circuit formed using the patterned conductive film and connected to the port for transmission/reception, transmission band filter and reception band filter is disposed on the substrate.

In an aspect of the present invention, the phase matching circuit is formed using a conductive film having a line pattern shape whose length extending to a connection end to the transmission band filter from that to the port for transmission/reception and whose length extending to a connection end to the reception band filter from that to the port for transmission/reception are set to required values. In an aspect of the present invention, the phase matching circuit is formed using at least one of a transmission side portion including an inductor and capacitor disposed between the port for transmission/reception and the transmission band filter, and a reception side portion including an inductor and capacitor disposed between the port for transmission/reception and the reception band filter. In an aspect of the present invention, the transmission band filter or the reception band filter contains a passive element formed on the substrate including the patterned conductive film.

In an aspect of the present invention, the passive element is an inductor connected in series with the first shunt element of the first circuit or the second shunt element of the second circuit, an inductor connected in parallel with the first series element of the first circuit, or a capacitor connected in parallel with the second series element of the second circuit.

In order to achieve the foregoing object, there is provided a filter connected between a first port and a second port, the filter comprising: a series element constituted of a film bulk acoustic resonator; and a shunt element constituted of a film bulk acoustic resonator, the first and second ports, the series element, and the shunt element being formed using a common substrate, the substrate being a ceramic substrate including a patterned conductive film in at least an inner part, the substrate comprising a passive element formed using the patterned conductive film and connected to the series element or the shunt element.

In an aspect of the present invention, the passive element is an inductor connected in series with the shunt element, an inductor connected in parallel with the series element, or a capacitor connected in parallel with the series element.

The ceramic substrate may be made of a laminate including a plurality of ceramic sheets and the patterned conductive film. The ceramic substrate may contain a mixture of ceramic and glass, and a sintering temperature of the ceramic substrate may be in a range of 800 to 950° C. The ceramic substrate may contain a mixture of alumina and borosilicate-based glass, a mixture of forsterite and borate-based glass, or tin barium borate. The patterned conductive film may be made of silver or copper.

BEST MODE FOR CARRYING OUT THE INVENTION

Embodiments of the present invention will hereinafter be described with reference to the drawings.

Figure 1:
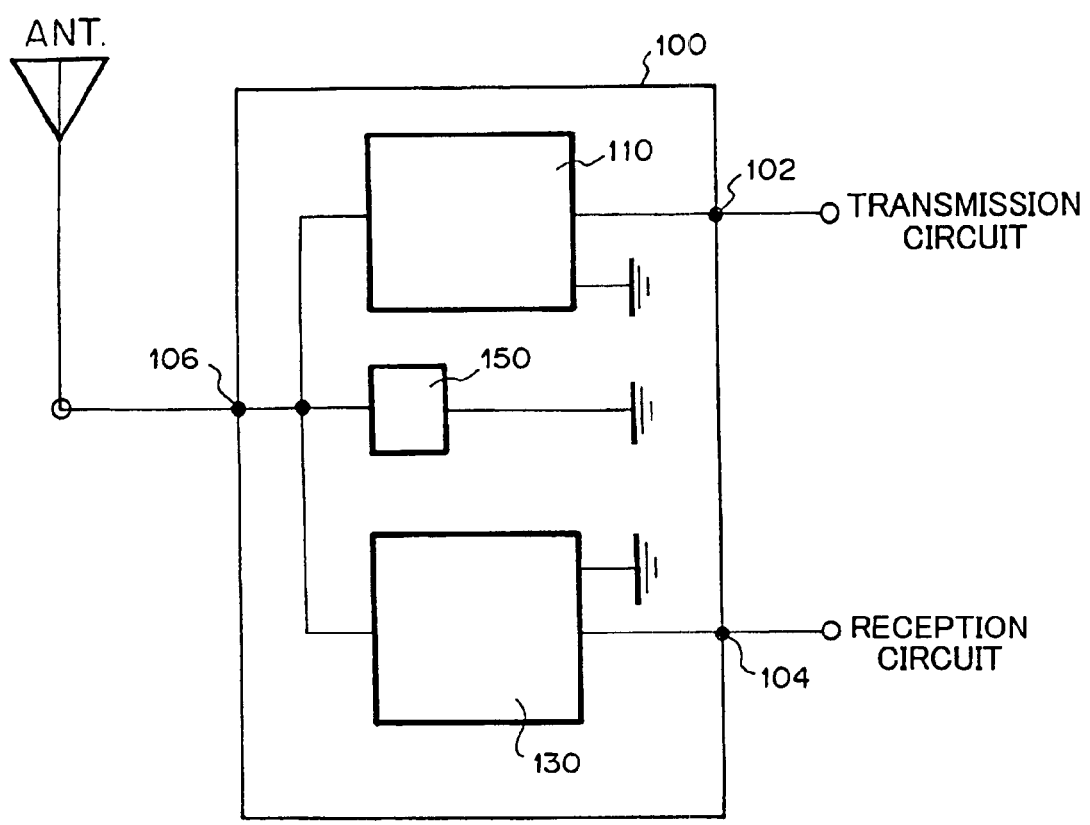
FIG. 1 is a block diagram showing a constitution of a duplexer of the present invention.

FIG. 1 is a block diagram showing a constitution of an embodiment of a duplexer or transmission/reception switch of the present invention. In FIG. 1, a duplexer 100 includes a transmission band filter 110, reception band filter 130, and film bulk acoustic resonator for adjustment 150. One end of the transmission band filter 110 is connected to a first port (transmission port) 102, and one end of the reception band filter 130 is connected to a second port (reception port) 104. The other ends of the transmission band filter 110 and reception band filter 130 are connected to a third port (antenna port which is a port both for transmission and reception) 106. For the film bulk acoustic resonator for adjustment 150, one end thereof is connected to the antenna port 106 (i.e., connected to the other ends of the transmission band filter 110 and reception band filter 130), and the other end is connected to the ground. The transmission port 102 is connected to a transmission circuit, the reception port 104 is connected to a reception circuit, and the antenna port 106 is connected to a transmission/reception antenna ANT.

Figure 2:
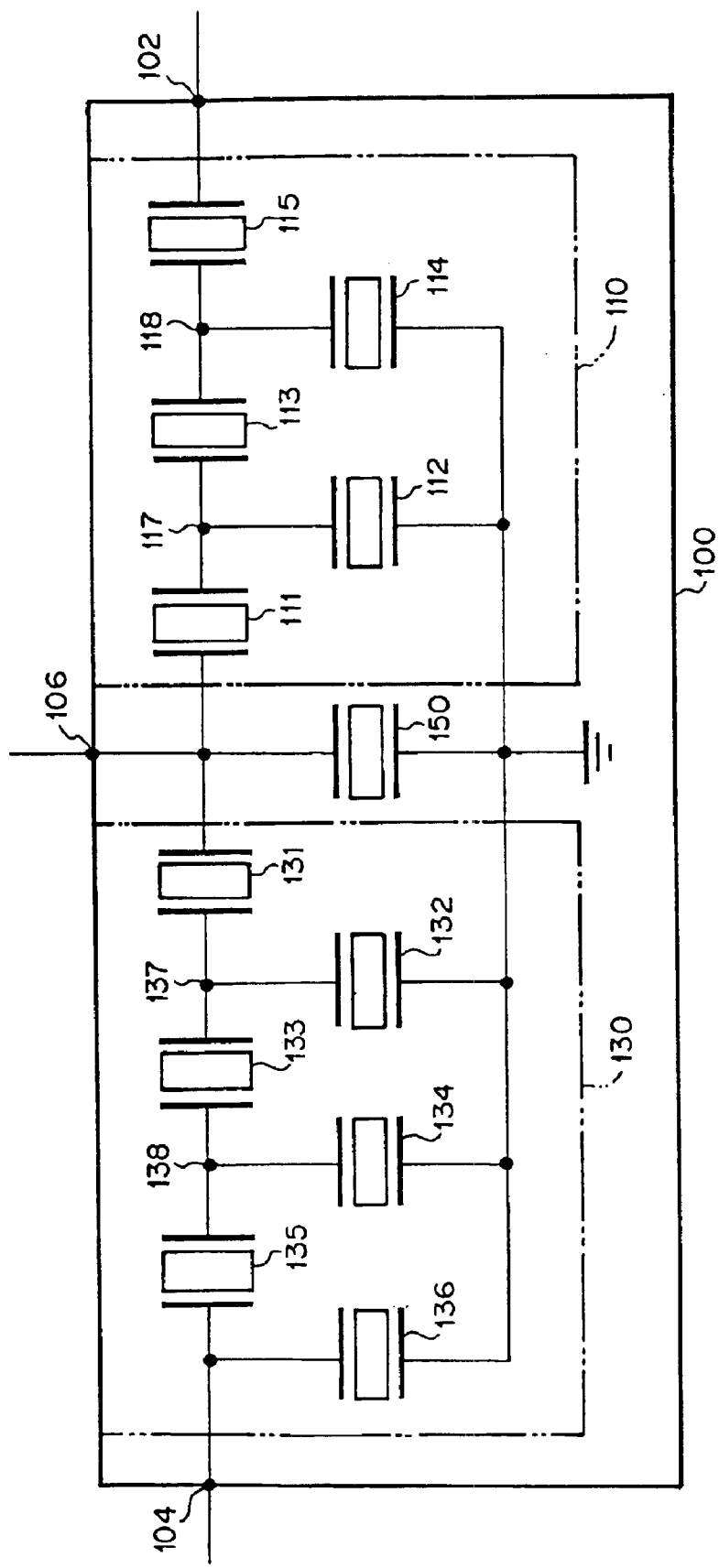
FIG. 2 is a circuit constitution diagram of the duplexer of the present invention.

FIG. 2 is a circuit constitution diagram of the duplexer 100 of the present embodiment. The film bulk acoustic resonator for adjustment 150 is disposed to connect the transmission band filter 110 to the reception band filter 130. Either the transmission band filter 110 or the reception band filter 130 includes a plurality of film bulk acoustic resonators (FBARs).

Here, the film bulk acoustic resonator will briefly be described.

Figure 3:
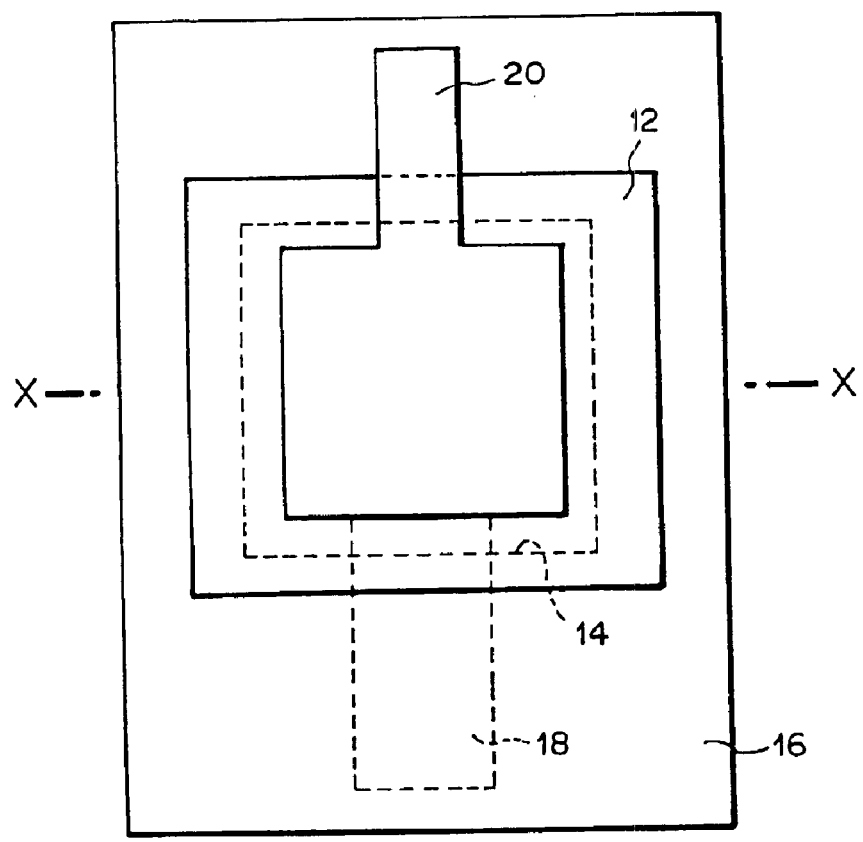
FIG. 3 is a schematic plan view of a film bulk acoustic resonator.
Figure 4:
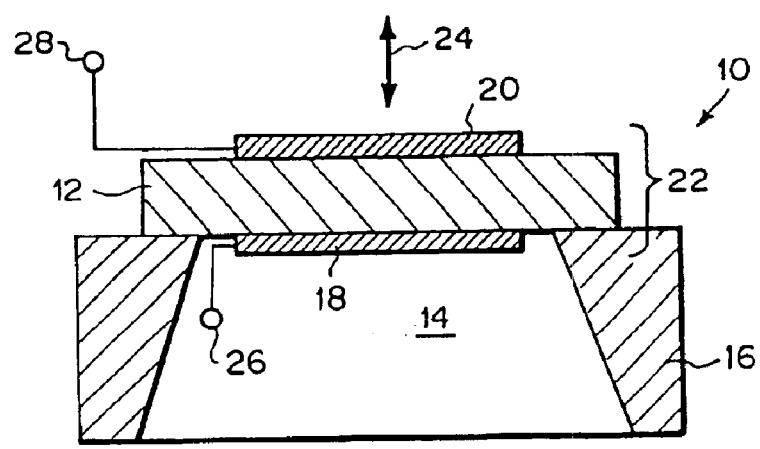
FIG. 4 is an X—X sectional view of FIG. 3.

FIG. 3 is a schematic plan view of the film bulk acoustic resonator, and FIG. 4 is an X—X sectional view thereof. A film bulk acoustic resonator 10 includes: a substrate 16 including a through-hole 14 vertically extending between upper and lower surfaces to form an air gap; and a piezoelectric stack 22 configured such that a peripheral edge thereof is hung and supported on the upper surface of the substrate 16 by an inner edge forming a through-hole opening in the upper surface of the substrate 16. The piezoelectric stack 22 includes a piezoelectric layer 12 and electrode layers 18, 20 bonded to both the upper and lower surfaces of the piezoelectric layer. Terminals 26, 28 are attached to the electrode layers 18, 20, and the terminals 26, 28 are connected to a power supply. In the acoustic resonator stack 22, the piezoelectric layer 12 expands and contracts in a direction shown by an arrow 24 in response to a voltage applied between the electrode terminals 26, 28.

The piezoelectric layer 12 contains piezoelectric materials which can be manufactured as a thin film, such as zinc oxide (ZnO) and aluminum nitride (AlN). The electrode layers 18, 20 is also be formed, for example, of gold (Au), molybdenum (Mo), or aluminum (Al). The substrate 16 is formed of materials such as silicon (Si), $SiO_2$, GaAs, and glass.

The acoustic resonator stack 22 constituted of a laminate of the piezoelectric layer 12 and electrode layers 18, 20 is hung in the peripheral edge thereof, and major surfaces both contact surrounding gases such as air or vacuum. In this case, the acoustic resonator stack 22 forms an acoustic resonator high in Q. Alternating-current signals applied to the electrode layers 18, 20 via the terminals 26, 28 have a frequency which is equal to a value obtained by dividing the velocity of sound in the acoustic resonator stack 22 by a double weighted thickness of the stack 22. That is, in case of $f_r=c/2t_0$ (where $f_r$ denotes a resonance frequency, c is the velocity of sound in the stack 22, and $t_0$ denotes the weighted thickness of the stack 22), the acoustic resonator stack 22 resonates in response to the alternating-current signal. Since the velocity of sound in the layer constituting the stack 22 differs with each material constituting each layer, the resonance frequency of the acoustic resonator stack 22 is determined not by a physical thickness but by the weighted thickness in which the velocity of sound in the piezoelectric layer 12 or electrode layers 18, 20 and the physical thicknesses of the layers are considered.

Figure 5:
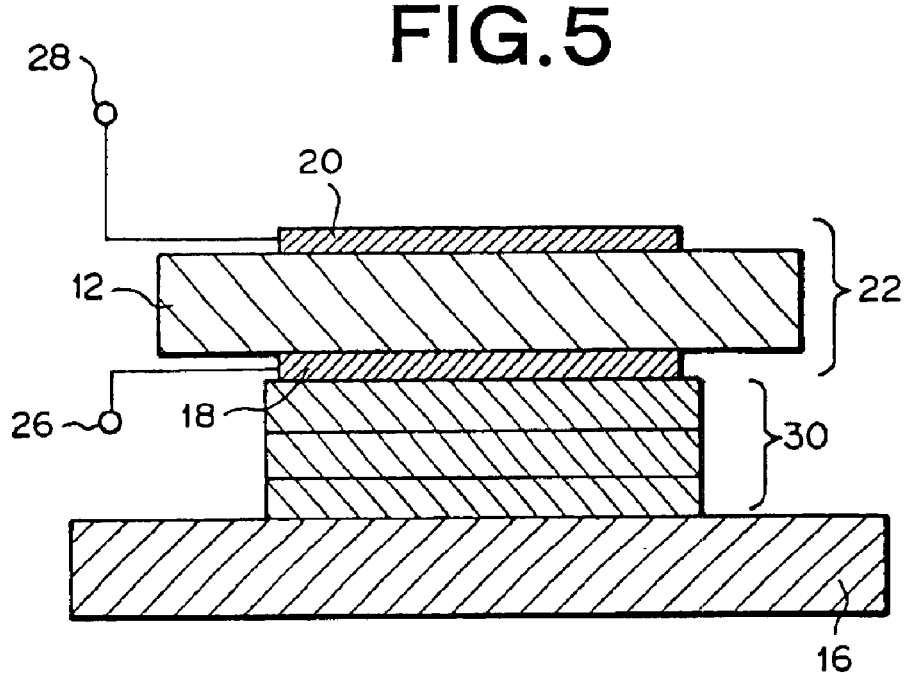
FIG. 5 is a schematic sectional view of the film bulk acoustic resonator.

FIG. 5 is a schematic sectional view of the film bulk acoustic resonator different from that of FIGS. 3 and 4. This example is the same as that of FIGS. 3 and 4 except that an acoustic impedance converter 30 is used instead of the air gap formed by the through-hole 14. This film bulk acoustic resonator is described, for example, in a paper entitled "Face-Mounted Piezoelectric Resonators" by W. E. Newell (Proceedings of the IEEE, pp. 575 to 581, June 1965), and the like.

Figure 6:
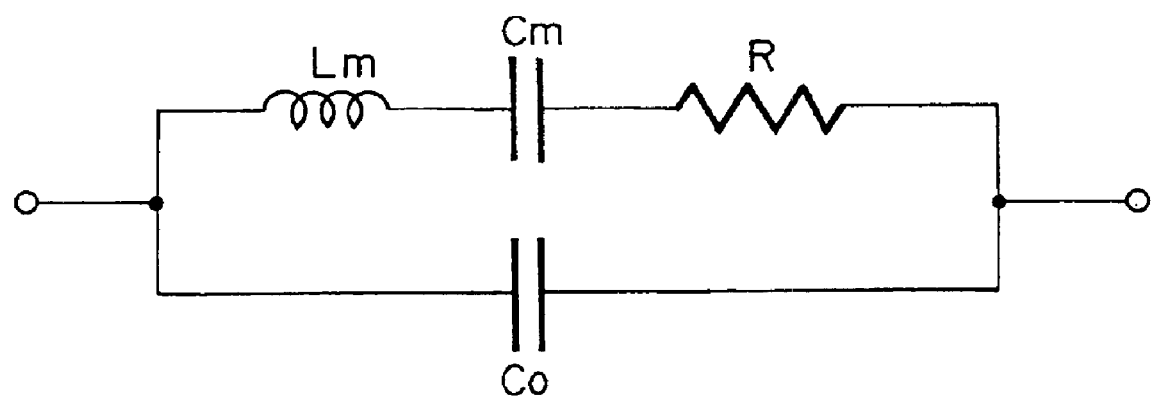
FIG. 6 is an equivalent circuit diagram of the film bulk acoustic resonator.

FIG. 6 shows an equivalent circuit of the film bulk acoustic resonator 10 constituted as described above. Series resonance of the resonator occurs by an equivalent inductance ($L_m$) and equivalent capacitance ($C_m$). Impedance of the resonator at series resonance frequency is low (i.e., in an ideal case in which the device has no loss, this resonator functions like a shunt). At a frequency lower than the series resonance frequency, the impedance of the film bulk acoustic resonator 10 has a capacitive property. At a frequency higher than the series resonance frequency and lower than a frequency of parallel resonance generated from an equivalent capacitance ($C_0$), the impedance of the film bulk acoustic resonator 10 has an inductive property. Moreover, at a frequency higher than the parallel resonance frequency, the impedance of the film bulk acoustic resonator 10 again has the capacitive property. At the parallel resonance frequency, the impedance of the resonator increases and, in an ideal system having no loss, the impedance becomes infinite, and is similar to an open circuit. In the present invention, since changes of the impedance around the series resonance frequency with respect to the film bulk acoustic resonator for adjustment 150 are used, the constitution of the duplexer is formed to be simple and small as described later.

For the individual resonators, the series resonance occurs by the equivalent inductance ($L_m$) and equivalent capacitance ($C_m$). Furthermore, by these and the equivalent capacitance ($C_0$), the parallel resonance occurs at the resonance frequency higher than that of the series resonance.

The transmission band filter 110 and reception band filter 130 will be described in further detail with reference to FIG. 2 again.

The transmission band filter 110 is a band filter of (2+1/2) stages connected so that series resonance elements 111, 113, 115 constituted of the film bulk acoustic resonators and shunt resonance elements 112, 114 constituted of the film bulk acoustic resonators form a ladder-type circuit. The ladder-type circuit is a general technique of using the acoustic resonator to constitute a band filter. The series resonance elements 111, 113, 115 are connected between the first port (transmission port) 102 and the third port (antenna port) 106. The shunt resonance element 112 connects the ground to a node 117 between the series resonance elements 111, 113. The shunt resonance element 114 connects the ground to a node 118 between the series resonance elements 113, 115.

The reception band filter 130 is a band filter of three stages connected so that series resonance elements 131, 133, 135 constituted of the film bulk acoustic resonators and shunt resonance elements 132, 134, 136 constituted of the film bulk acoustic resonators form the ladder-type circuit. The series resonance elements 131, 133, 135 are connected between the second port (reception port) 104 and the third port (antenna port) 106. The shunt resonance element 132 connects the ground to a node 137 between the series resonance elements 131, 133. The shunt resonance element 134 connects the ground to a node 138 between the series resonance elements 133, 135. The shunt resonance element 136 connects the ground to the second port (reception port) 104.

One end of the film bulk acoustic resonator for adjustment 150 is connected to the third port (i.e., connected to a connection portion between the series resonance element 111 of the transmission band filter 110 and the series resonance element 131 of the reception band filter 130), and the other end thereof is connected to the ground.

The film bulk acoustic resonator for adjustment 150 functions as a shunt resonator added to the ladder-type circuit of the transmission band filter 110 in one aspect, and accordingly characteristics of the transmission band filter of three stages are obtained. In a phone, usually a transmission frequency pass band is set to be lower than a reception frequency pass band. For example, in a CDMA-PCS phone, the transmission frequency pass band is 1.85 to 1.91 GHz, and the reception frequency pass band is 1.93 to 1.99 GHz. Therefore, for the transmission band filter 110, a steep and large attenuation is required at a frequency higher than that of the pass band. When the characteristics of the transmission band filter of three stages are obtained, the characteristics substantially meet this requirement, and the duplexer can be miniaturized.

The film bulk acoustic resonator for adjustment 150 functions as the shunt resonator added to the ladder-type circuit of the reception band filter 130 in the other aspect, and accordingly the characteristics of the reception band filter of (3+1/2) stages are obtained. For the reception band filter 130, the steep and large attenuation is required at a frequency lower than that of the pass band. When the characteristics of the reception band filter of (3+1/2) stages are obtained, the characteristics substantially meet this requirement, and the duplexer can be miniaturized.

The series resonance frequency of the film bulk acoustic resonator for adjustment 150 is set to an appropriate value which is larger than an upper limit value (1.91 GHz for the CDMA-PCS phone) of the transmission frequency pass band of the transmission band filter 110 and smaller than a lower limit value (1.93 GHz for the CDMA-PCS phone) of the reception frequency pass band of the reception band filter 130. Accordingly, the duplexer 100 can be operated while the transmission band filter 110 and reception band filter 130 are not mutually influenced. This is because the transmission frequency pass band is lower than the series resonance frequency of the resonator 150, and the resonator 150 therefore shows the capacitive property in the circuit in the transmission frequency pass band, and behaves by the function like LPF as if the reception band filter 130 did not exist. Moreover, the reception frequency pass band is higher than the series resonance frequency of the resonator 150, and the resonator 150 therefore shows the inductive property in the circuit in the reception frequency pass band, and behaves by the function like HPF as if the presence of the transmission band filter 110 were ignored. Therefore, by the presence of the resonator 150, the transmission signal applied to the first port (transmission port) 102 flows to the third port (antenna port) 106 from the first port (transmission port) 102, and hardly influences the second port (reception port) 104 or the reception band filter 130. Moreover, by the presence of the resonator 150, the reception signal coming via the third port (antenna port) 106 passes through the reception band filter 130 to reach the second port (reception port) 104 without being influenced by the transmission band filter 110 or the first port (transmission port) 102.

Figure 7:
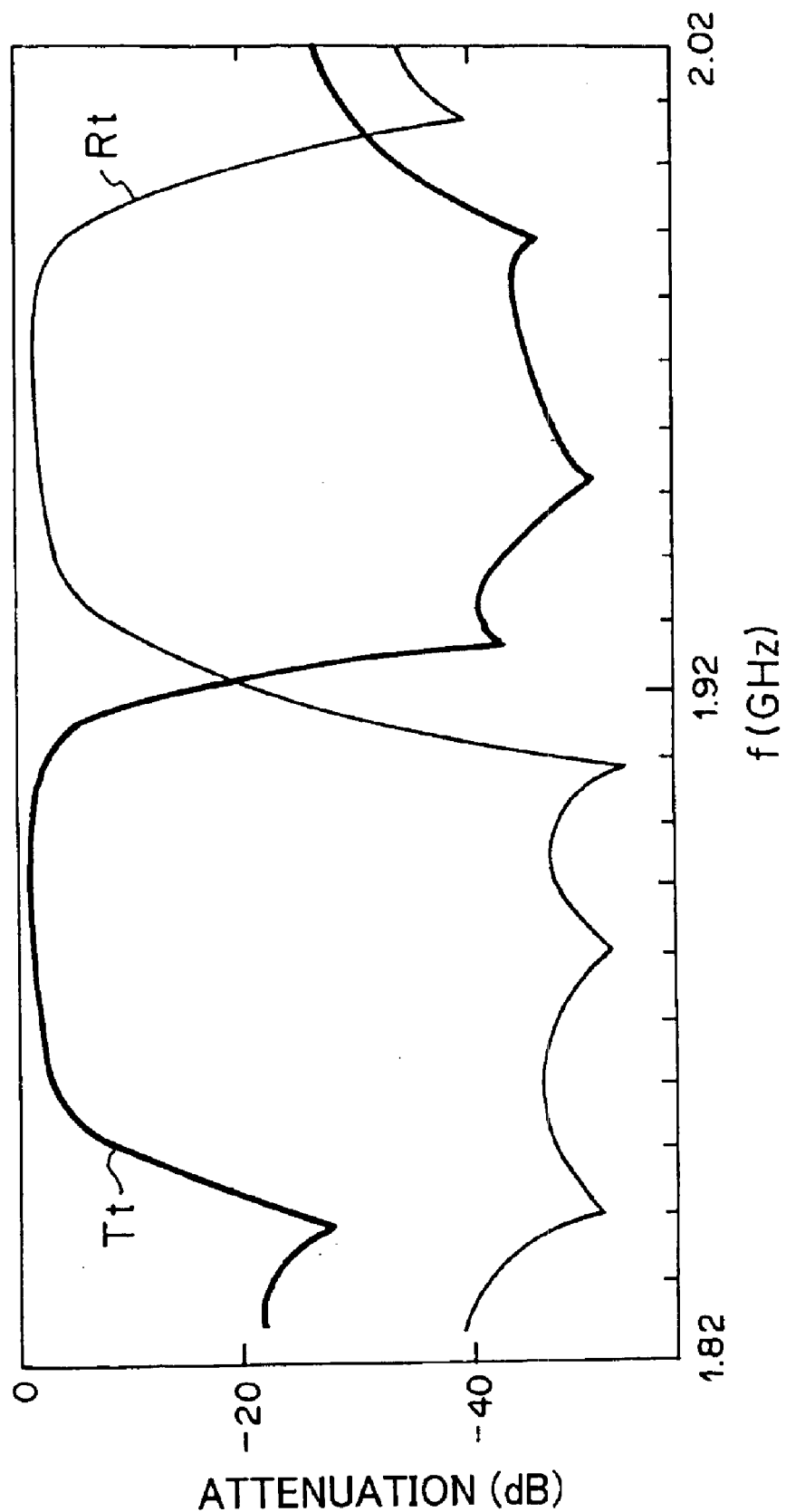
FIG. 7 is a graph showing one example of transmission and reception pass characteristics of the duplexer of the present invention.

FIG. 7 shows one example of transmission pass characteristics Tt and reception pass characteristics Rt of the duplexer 100 including the film bulk acoustic resonator for adjustment 150 constituted as described above.

Since the film bulk acoustic resonator for adjustment 150 can easily be constituted to be monolithic together with the film bulk acoustic resonators constituting the transmission band filter 110 and reception band filter 130, the duplexer can be miniaturized also in this meaning.

Figure 8:
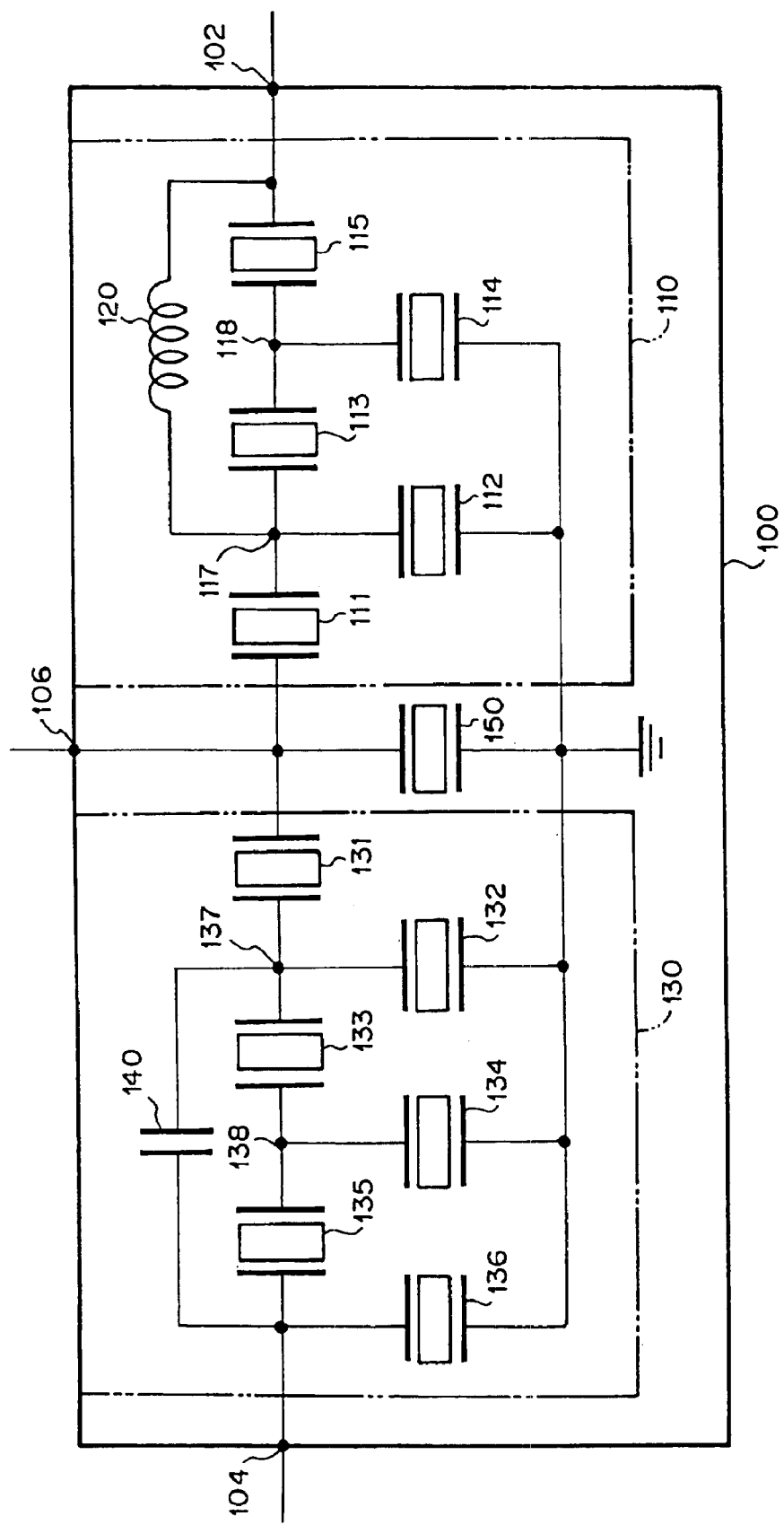
FIG. 8 is a circuit constitution diagram of the duplexer of the present invention.

FIG. 8 is a circuit constitution diagram of still another embodiment of the duplexer of the present invention. In the figure, members or parts having functions similar to those in FIGS. 1 to 7 are denoted with the same reference numerals.

In the present embodiment, in the transmission band filter 110, the node 117 is connected to the first port (transmission port) 102 via an inductor 120 which is an additional passive element. That is, the inductor 120 is connected in parallel with the series resonance elements 113, 115. An additional resonance circuit is formed between the equivalent capacitance $C_0$ of each series resonance element and the inductor 120. Accordingly, a new attenuation pole is formed in a desired attenuation band (especially a frequency close to the pass band and higher than the pass band), and further better transmission filter characteristics can be obtained with a smaller number of stages.

Moreover, in the present embodiment, the node 137 is connected to the second port 104 via a capacitor 140 which is an additional passive element. That is, the capacitor 140 is connected in parallel with the series resonance elements 133, 135. The additional resonance circuit is formed between each series resonance element and the capacitor 140. Accordingly, the new attenuation pole is formed in the desired attenuation band (especially a frequency close to the pass band and lower than the pass band), and further better reception filter characteristics can be obtained with the smaller number of stages.

It is to be noted that in the above-described embodiment one film bulk acoustic resonator for adjustment 150 is used, but two or more film bulk acoustic resonators for adjustment can also be used in the present invention.

Figure 9:
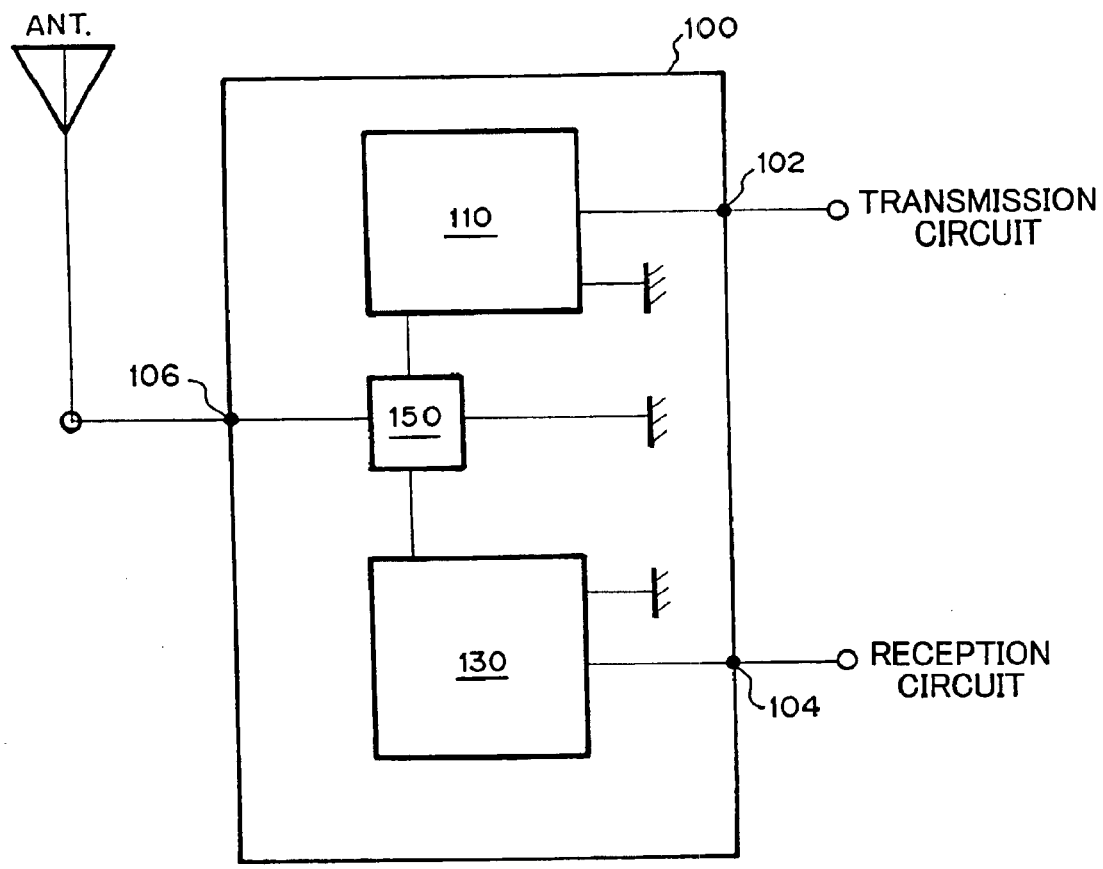
FIG. 9 is a block diagram showing a constitution of the duplexer of the present invention.

FIG. 9 is a block diagram showing the constitution of the embodiment of the duplexer of the present invention. In FIG. 9, the duplexer 100 includes the transmission band filter 110, the reception band filter 130, and a phase matching circuit 150. One end of the transmission band filter 110 is connected to the first port (transmission port) 102, and one end of the reception band filter 130 is connected to the second port (reception port) 104. The other ends of the transmission band filter 110 and reception band filter 130 are connected to the third port (antenna port which is the port both for transmission and reception) 106 via the phase matching circuit 150. That is, the phase matching circuit 150 is connected to the antenna port 106, transmission band filter 110, and reception band filter 130, respectively. The transmission port 102 is connected to the transmission circuit, the reception port 104 is connected to the reception circuit, and the antenna port 106 is connected to the transmission/reception antenna ANT.

Figure 10:
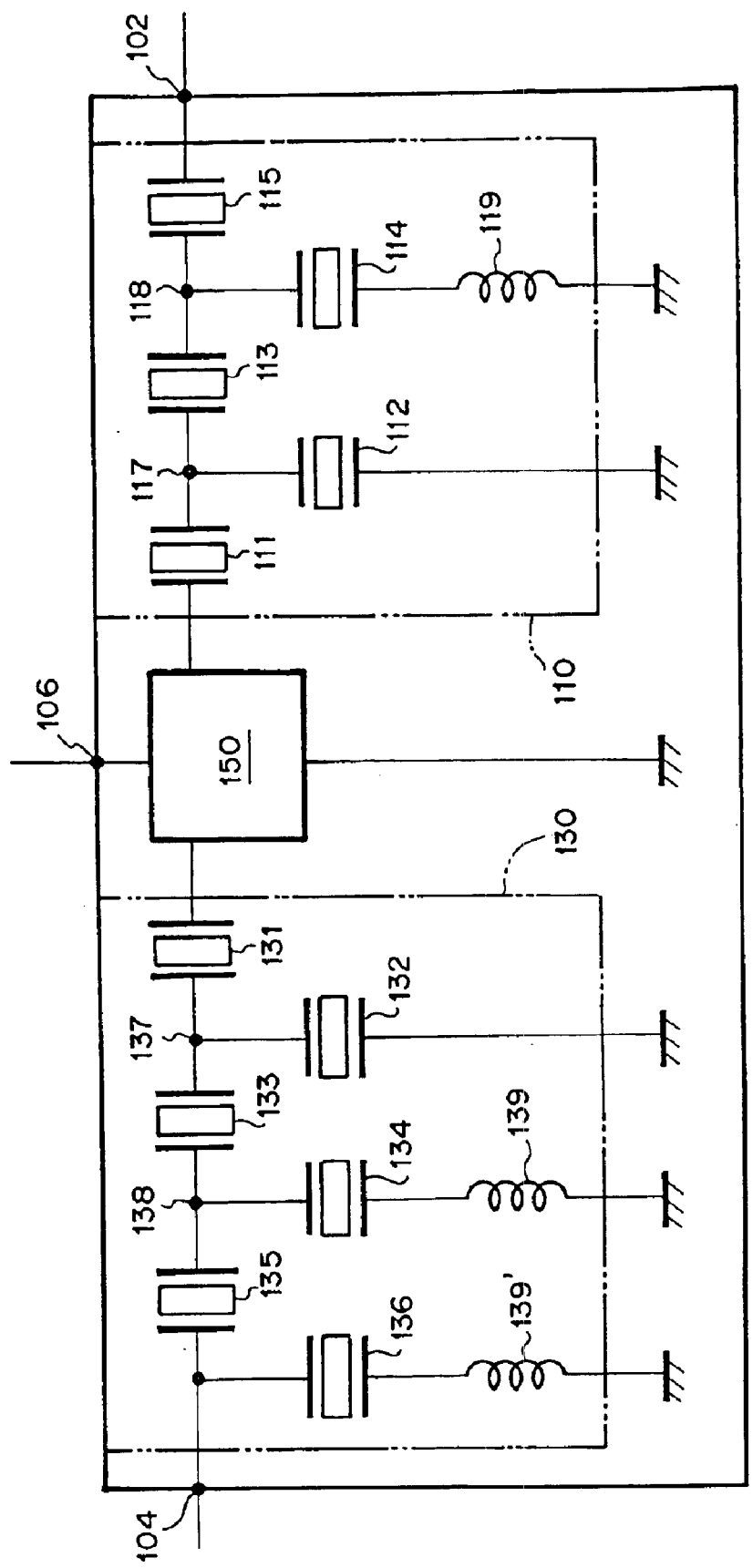
FIG. 10 is a circuit constitution diagram of the duplexer of the present invention.

FIG. 10 is a circuit constitution diagram of the duplexer 100 of the present embodiment. The phase matching circuit 150 is disposed to connect the transmission band filter 110 to the reception band filter 130. Either the transmission band filter 110 or the reception band filter 130 includes a plurality of film bulk acoustic resonators (FBARs).

The transmission band filter 110 and reception band filter 130 will be described in further detail with reference to FIG. 10.

The transmission band filter 110 is a band filter of (2+1/2) stages connected so that the series resonance elements 111, 113, 115 which are first series elements constituted of the film bulk acoustic resonators and the shunt resonance elements 112, 114 which are first shunt elements constituted of the film bulk acoustic resonators form the ladder-type circuit which is a first circuit. The ladder-type circuit is a general technique of using the acoustic resonator to constitute the band filter. The series resonance elements 111, 113, 115 are connected between the first port (transmission port) 102 and the phase matching circuit 150. The shunt resonance element 112 connects the ground to the node 117 between the series resonance elements 111, 113. The shunt resonance element 114 connects the ground to the node 118 between the series resonance elements 113, 115. It is to be noted that as shown an inductor 119 is disposed between the shunt resonance element 114 and the ground. The inductor 119 also functions as a passive element for obtaining filter characteristics close to desired characteristics (i.e., enhancing the filter characteristics). When inductance of the inductor 119 is appropriately set, the pass band of the transmission band filter 110 can be set substantially as desired.

The reception band filter 130 is a band filter of three stages connected so that the series resonance elements 131, 133, 135 which are second series elements constituted of the film bulk acoustic resonators and the shunt resonance elements 132, 134, 136 which are second shunt elements constituted of the film bulk acoustic resonators form the ladder-type circuit which is a second circuit. The series resonance elements 131, 133, 135 are connected between the second port (reception port) 104 and the phase matching circuit 150. The shunt resonance element 132 connects the ground to the node 137 between the series resonance elements 131, 133. The shunt resonance element 134 connects the ground to the node 138 between the series resonance elements 133, 135. The shunt resonance element 136 connects the ground to the second port (reception port) 104. It is to be noted that, as shown, inductors 139, 139' are disposed between the shunt resonance elements 134, 136 and the ground, respectively. The inductors 139, 139' function as passive elements for obtaining the filter characteristics substantially as desired (i.e., enhancing the filter characteristics). When the inductances of the inductors 139, 139' are appropriately set, the pass band of the reception band filter 130 can be set substantially as desired to be different from that of the transmission band filter 110.

The phase matching circuit 150 is connected to the third port (antenna port which is the port both for the transmission and reception) 106, the series resonance element 111 of the transmission band filter 110, and the series resonance element 131 of the reception band filter 130, respectively. It is to be noted that in FIGS. 9 and 10 the phase matching circuit 150 is connected to the ground, but the phase matching circuit 150 does not have to be connected to the ground.

Figure 11A:
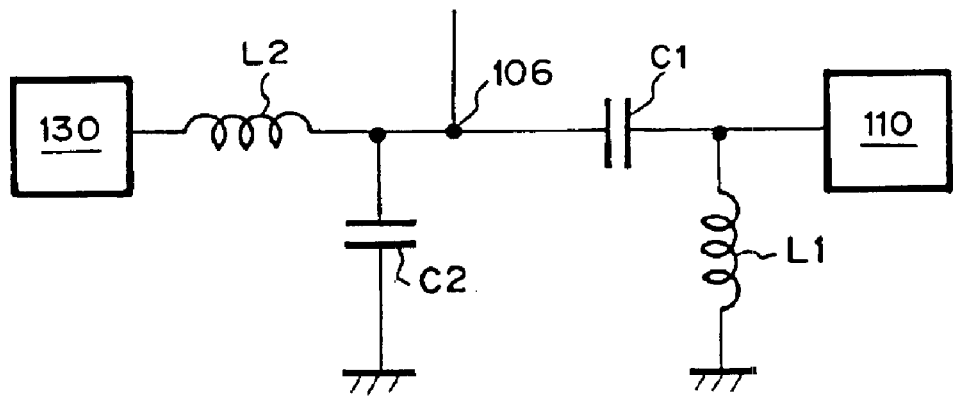
FIGS. 11A, 11B, and 11C are circuit diagrams each showing an example of a phase matching circuit.
Figure 11B:
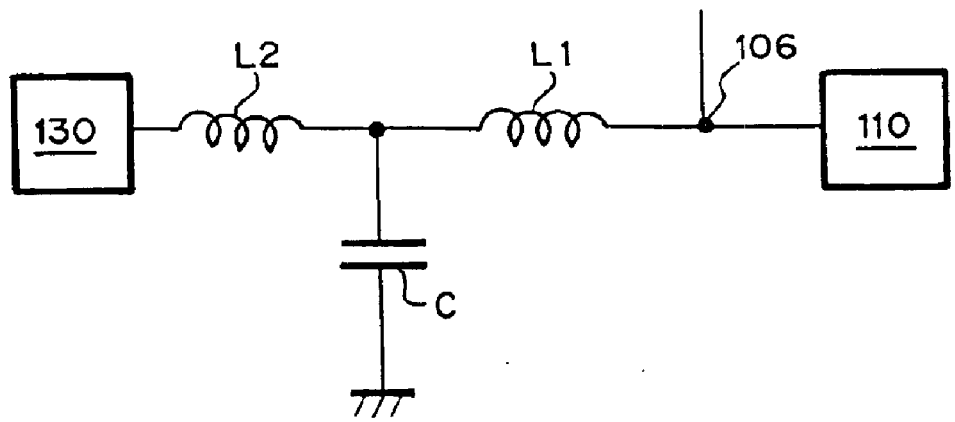
Figure 11C:
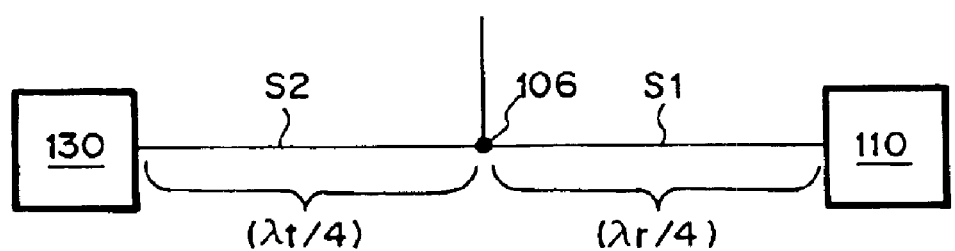

FIGS. 11A, 11B, and 11C are circuit diagrams showing an example of the phase matching circuit 150. In FIG. 11A, the phase matching circuit 150 is formed using a transmission side portion including an inductor L1 and capacitor C1 disposed between the antenna port 106 and transmission band filter 110, and a reception side portion including an inductor L2 and capacitor C2 disposed between the antenna port 106 and reception band filter 130. In FIG. 11B, the phase matching circuit 150 is formed using only the reception side portion including the inductors L1, L2 and capacitor C disposed between the antenna port 106 and reception band filter 130. It is possible to form the phase matching circuit 150 using only the transmission side portion. In FIG. 11C, the phase matching circuit 150 is formed using a conductive film S1 having a line pattern shape extending to a connection end to the transmission band filter 110 from that to the antenna port 106, and a conductive film S2 having a line pattern shape extending to the connection end to the reception band filter 130 from that to the antenna port 106. Here, assuming that a central frequency of the transmission band filter 110 is ft, the central frequency of the reception band filter 130 is fr, the light velocity is c, and an effective specific inductive capacity of the substrate 16 on which the conductive films S1, S2 are formed is ϵr, a length of the conductive film S1 is set to $(\lambda r/4)=c/[4\sqrt{(\epsilon r)}fr]$ and the length of the conductive film S2 is set to $(\lambda t/4)=c/[4\sqrt{(\epsilon r)}ft]$. λt, λr denote wavelengths corresponding to the frequencies ft, fr, respectively.

By the presence of the appropriately set phase matching circuit 150, the transmission signal applied to the first port (transmission port) 102 flows to the third port (antenna port) 106 from the first port (transmission port) 102, and hardly influences the second port (reception port) 104 or the reception band filter 130. Moreover, by the presence of the phase matching circuit 150, the reception signal coming via the third port (antenna port) 106 passes through the reception band filter 130 to reach the second port (reception port) 104 without being influenced by the transmission band filter 110 or the first port (transmission port) 102. Therefore, the circuit steadily functions as the duplexer.

Figure 12:
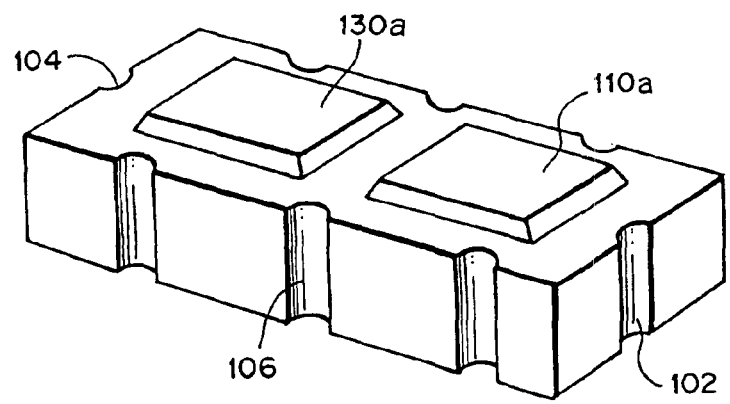
FIG. 12 is a perspective view of the duplexer of the present invention.
Figure 13:
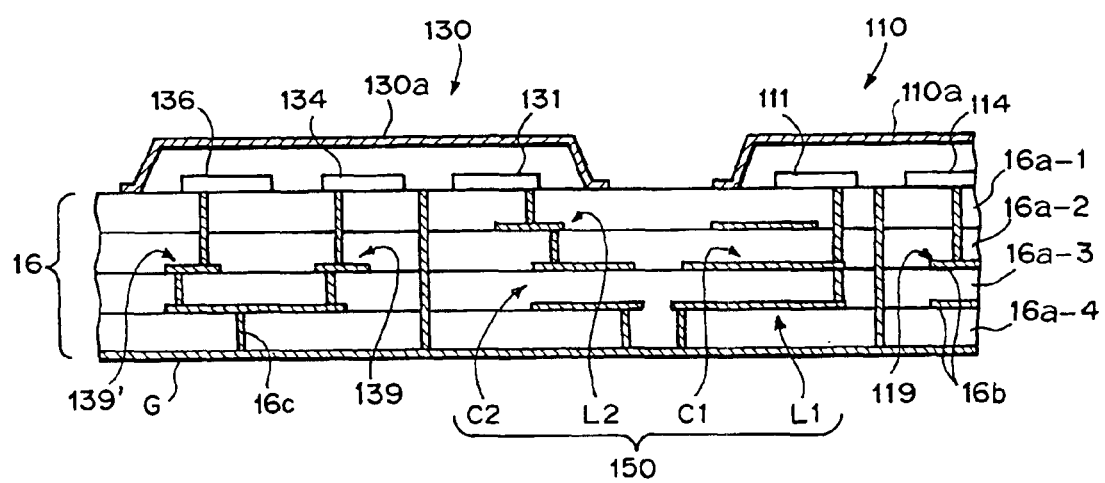
FIG. 13 is a partial sectional view of FIG. 12.

FIG. 12 is a perspective view of the duplexer, and FIG. 13 is a partial sectional view of the duplexer. The substrate 16 is a ceramic substrate. As shown in FIG. 13, the ceramic substrate 16 is made of a laminate including a plurality of ceramic sheets 16a-1, 16a-2, 16a-3, 16a-4 and patterned conductive films 16b positioned between the ceramic sheets disposed adjacent to each other. The ceramic sheet is formed, for example, of a mixture of ceramic and glass. Alternatively, the ceramic sheet is formed, for example, of a mixture of alumina and borosilicate-based glass, a mixture of forsterite and borate-based glass, or tin barium borate. Moreover, the conductive films 16b are formed, for example, of silver or copper high in conductivity. For the laminate of the ceramic sheet and patterned conductive film, a silver or copper paste is applied in a desired pattern between adjacent ceramic green sheets among a plurality of ceramic green sheets, and sintered at 800 to 950° C. which is a relatively low temperature so that the laminate can easily be obtained. Through-holes are formed in appropriate positions in the ceramic sheet, and the patterned conductive film 16b is connected to another film of the adjacent layer via a through-hole conductor 16c charged in the through-hole.

The thickness of the ceramic substrate 16 is, for example, 0.5 to 1.2 mm, that of each of the ceramic sheets 16a-1, 16a-2, 16a-3, 16a-4 is, for example, 0.02 to 0.3 mm, and that of the patterned conductive film 16b is, for example, 0.005 to 0.02 mm. It is to be noted that only a required number of ceramic sheets for forming a desired circuit element by the patterned conductive films 16b may be used.

In the ceramic substrate 16, the materials of the ceramic sheets disposed adjacent to each other may be either different or the same. When the materials of the adjacent ceramic sheets are the same, the individual sheets cannot be distinguished in some case. Even in such a case, the substrate is included in the ceramic substrate mentioned in the present invention.

Figure 14A:
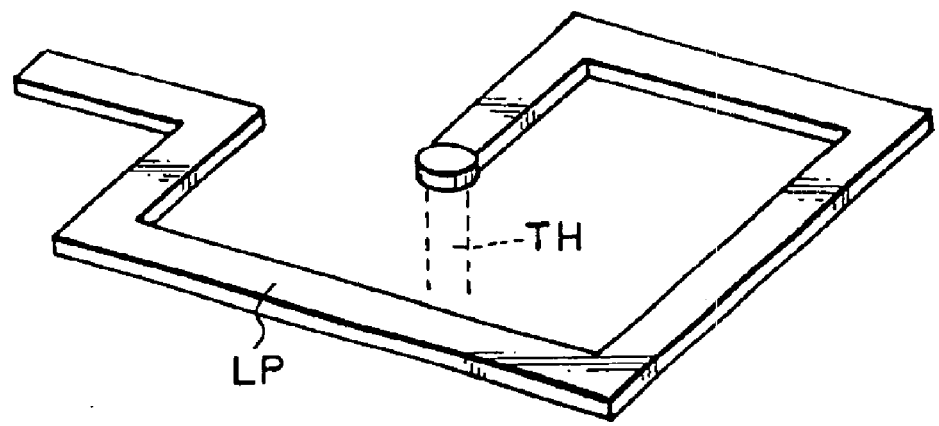
FIGS. 14A and 14B are schematic perspective views each showing an example of a passive element formed by a patterned conductive film in a substrate.
Figure 14B:
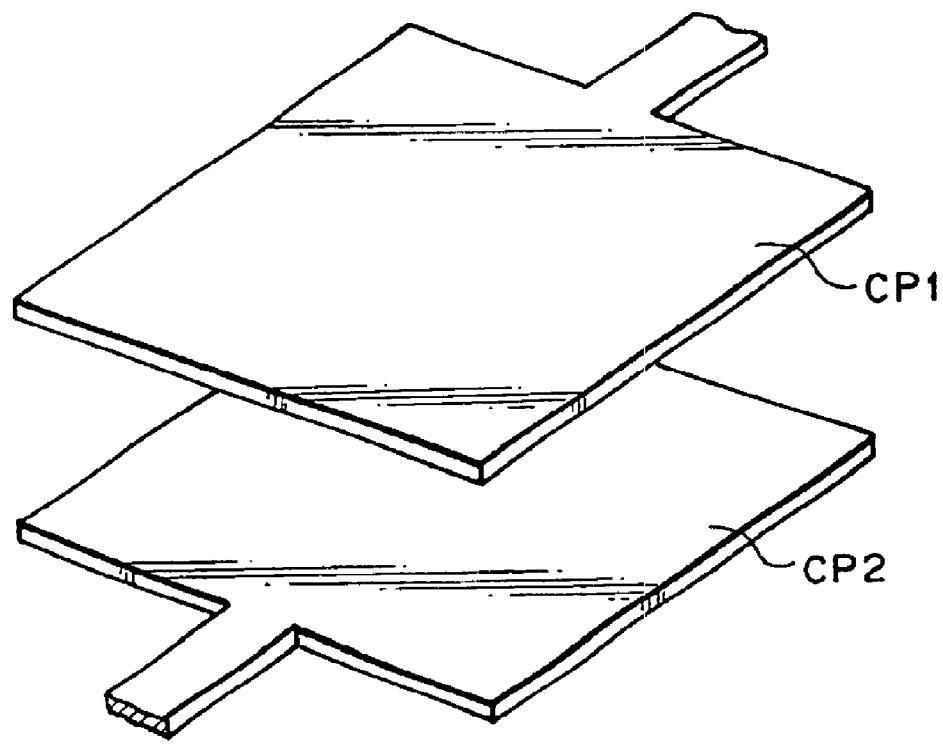

FIGS. 14A and 14B are schematic perspective views showing an example of a passive element formed by the patterned conductive film 16b in the substrate 16. FIG. 14A shows the inductor, and the inductor is formed in a spiral pattern LP in the same plane. The spiral pattern may also be connected to that of the adjacent layer via the through-hole conductor in a through-hole TH formed in the ceramic sheet. FIG. 14B shows a capacitor, and the capacitor is constituted of planar electrodes CP1, CP2 of two layers disposed adjacent to each other.

In FIG. 13, the phase matching circuit 150 of FIG. 11A described above is formed in the substrate 16, and further the inductors 119, 139, 139' are formed. On the upper surface of the substrate 16, the resonance elements 111, 114, etc. constituting the transmission band filter 110 and the resonance elements 131, 134, 136, etc. constituting the reception band filter 130 are disposed. To cover these resonance elements, on the upper surface of the substrate 16, a cover member 110a on the side of the transmission band filter and a cover member 130a on the side of the reception band filter are bonded. A ground conductive film G is attached to substantially the whole lower surface of the substrate 16.

As described above, the transmission port 102, reception port 104, antenna port 106, transmission band filter 110, and reception band filter 130 are formed using the common substrate 16, and the substrate 16 is constituted of the laminate including a plurality of ceramic sheets and patterned conductive films. Accordingly, the phase matching circuit 150 and further the inductors 119, 139, 139' which are the passive elements for enhancing the filter characteristics can be made in the substrate 16. Therefore, the duplexer can be miniaturized using advantages resulting from the film bulk acoustic resonator of the small size. Moreover, since the patterned conductive film constituted of Ag, Cu high in conductivity can be used, and the capacitor or the inductor high in Q value can be constituted, the small-sized duplexer can be constituted without substantially deteriorating the filter characteristics.

Figure 16A:
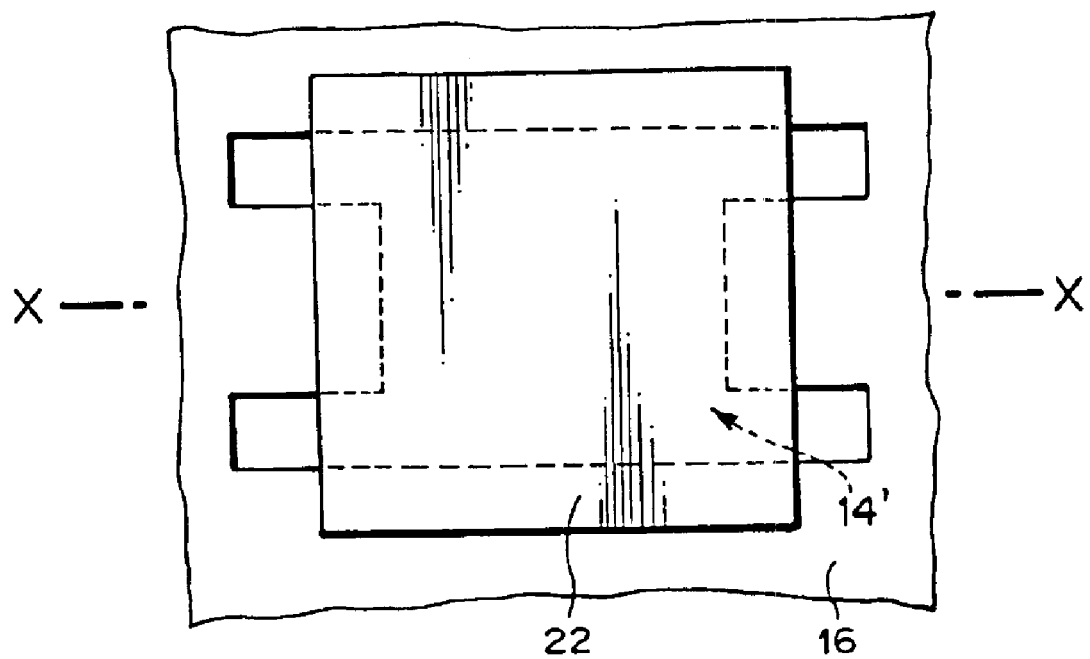
FIG. 16A is a diagram showing a configuration of an acoustic resonator stack attached to a ceramic substrate.
Figure 16B:
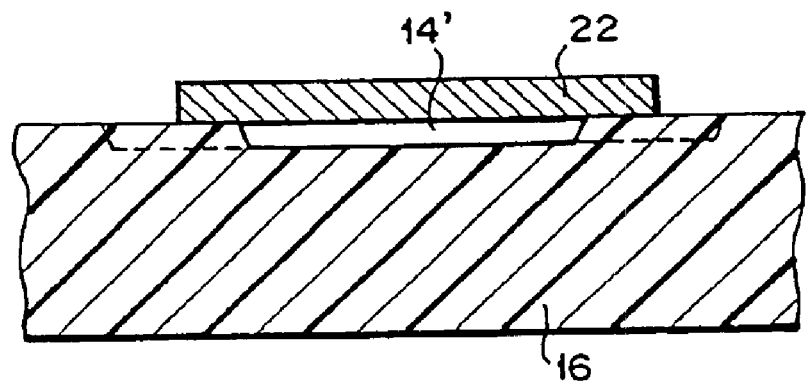
FIG. 16B is an X—X sectional view of FIG. 16A.

FIGS. 16A and 16B are diagrams showing still another embodiment of the attachment of the acoustic resonator stack with respect to the ceramic substrate, wherein FIG. 16A shows a schematic plan view, and FIG. 16B shows an X—X sectional view thereof. A concave portion 14' is formed below the acoustic resonator stack 22 in the upper surface of the ceramic substrate 16. The concave portion 14' has a depth to such an extent that vibration of the acoustic resonator stack 22 in a vertical direction is permitted, and the depth is, for example, about several microns. The concave portion 14' is formed in the substrate material before sintering, the concave portion 14' is filled with a synthetic resin after the sintering, the acoustic resonator stack 22 is formed on the portion, and the synthetic resin in the concave portion 14' is removed. Accordingly, the configuration of FIGS. 16A and 16B can be obtained. The acoustic resonator stack 22 may be formed on a film beforehand, and fixed to the ceramic substrate 16 by using metal bumps such as solder balls with a space interposed therebetween.

Figure 15:
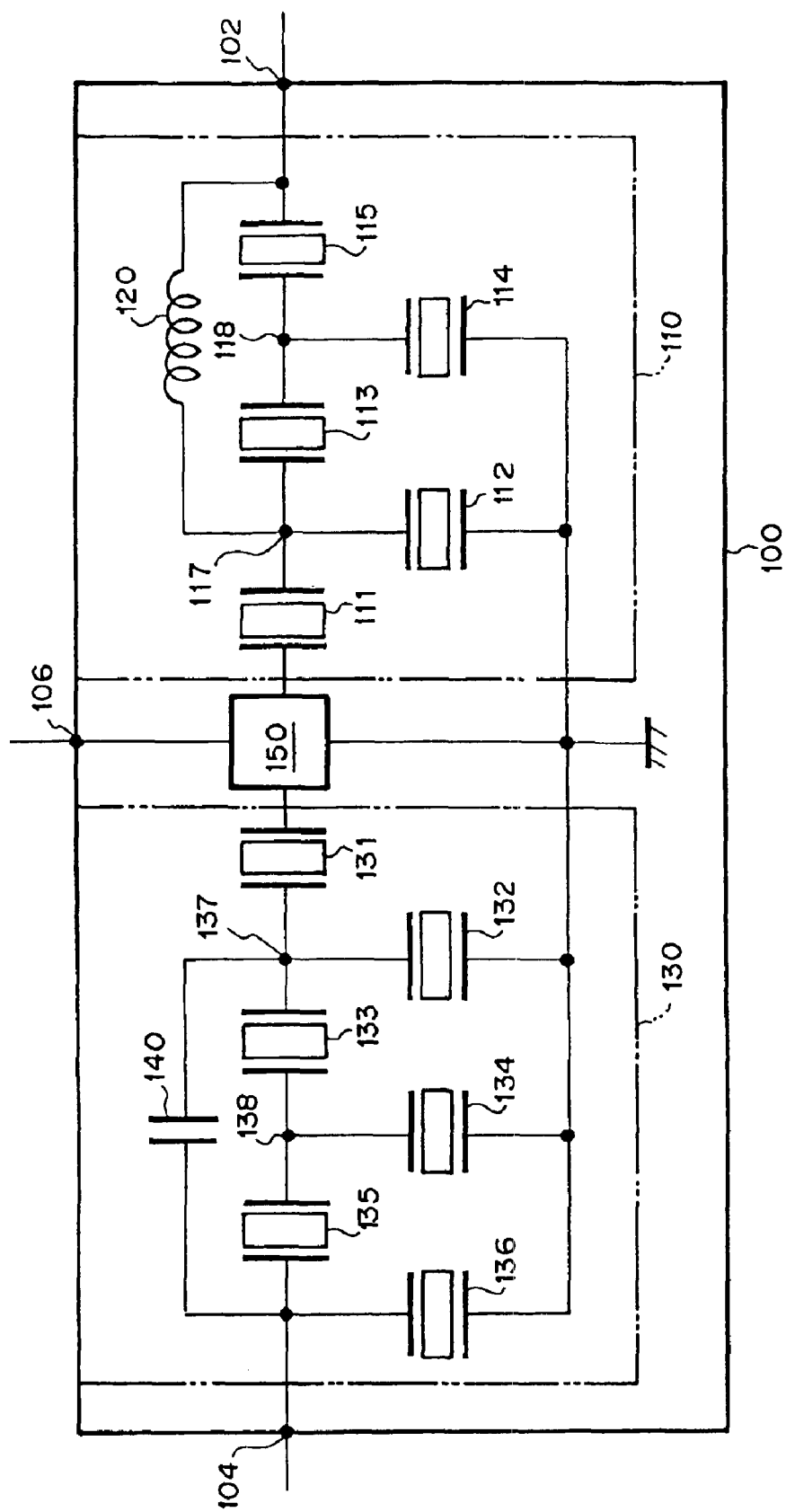
FIG. 15 is a still another circuit constitution diagram of the duplexer of the present invention.

FIG. 15 is a circuit constitution diagram of a still another embodiment of the duplexer of the present invention. In the figure, the members or parts having the functions similar to those in FIGS. 1 to 14 are denoted with the same reference numerals.

In the present embodiment, in the transmission band filter 110, the node 117 is connected to the first port (transmission port) 102 via the inductor 120 which is the additional passive element. That is, the inductor 120 is connected in parallel with the series resonance elements 113, 115. The additional resonance circuit is formed between the equivalent capacitance $C_0$ of each series resonance element and the inductor 120. Accordingly, the new attenuation pole is formed in the desired attenuation band (especially the frequency close to the pass band and higher than the pass band), and further better transmission filter characteristics can be obtained with the smaller number of stages.

Moreover, in the present embodiment, the node 137 is connected to the second port (reception port) 104 via the capacitor 140 which is the additional passive element. That is, the capacitor 140 is connected in parallel with the series resonance elements 133, 135. The additional resonance circuit is formed between each series resonance element and the capacitor 140. Accordingly, the new attenuation pole is formed in the desired attenuation band (especially the frequency close to the pass band and lower than the pass band), and further better reception filter characteristics can be obtained with the smaller number of stages.

It is to be noted that in-the above-described embodiment one phase matching circuit 150 is used, but two or more phase matching circuits can also be used in the present invention.

INDUSTRIAL APPLICABILITY

As described above, according to the present invention, an element constituted of a film bulk acoustic resonator is used, and therefore it is possible to provide a duplexer whose reliability or stability of filter characteristics is not impaired even at a power level exceeding 1 watt and which has sufficiently steep attenuation characteristics. There can also be provided a duplexer which is considerably small in size and height as compared with a ceramic filter. Since the film bulk acoustic resonator for adjustment is used even in connecting a transmission band filter to a reception band filter, a monolithic element is easily constituted, and a manufacturing cost of the duplexer can be reduced.

Moreover, as described above, according to the duplexer of the present invention, the transmission port, reception port, port for both the transmission and reception, the transmission band filter including film bulk acoustic resonator, and the reception band filter including the film bulk acoustic resonator are formed using the common ceramic substrate including the patterned conductive film. In the ceramic substrate, the patterned conductive film is used to form the phase matching circuit, and therefore miniaturization, enhancement of power handling capability, facilitation of manufacturing, and cost reduction are possible.

Furthermore, according to the filter of the present invention, the series element constituted of the film bulk acoustic resonator and the shunt element constituted of the film bulk acoustic resonator are formed using the common ceramic substrate including the patterned conductive film together with first and second ports, and the passive element is disposed using the patterned conductive film in the ceramic substrate, so that the miniaturization, enhancement of the power handling capability, facilitation of the manufacturing, and cost reduction are possible.

What is claimed is:

1. A duplexer comprising:
a transmission port, reception port, and transmission/reception port;
a transmission band filter which is connected between the transmission port and transmission/reception port and which includes a first ladder-type circuit including a first series element constituted of a film bulk acoustic resonator and a first shunt element constituted of a film bulk acoustic resonator and which has a transmission frequency pass band; and
a reception band filter which is connected between the reception port and transmission/reception port and which includes a second ladder-type circuit including a second series element constituted of a film bulk acoustic resonator and a second shunt element constituted of a film bulk acoustic resonator and which has a reception frequency pass band not overlapped with the transmission frequency pass band,
wherein at least one film bulk acoustic resonator for adjustment is connected between the port for transmission/reception and the first and second shunt elements, and a resonance frequency of the film bulk acoustic resonator for adjustment is set between the transmission frequency pass band and the reception frequency pass band.

2. The duplexer according to claim 1, wherein the film bulk acoustic resonator for adjustment is connected between the port for transmission/reception and a ground, and the first and second shunt elements are connected to the ground.

3. The duplexer according to claim 1, wherein the transmission frequency pass band is set to be lower than the reception frequency pass band, and the resonance frequency of the film bulk acoustic resonator for adjustment is set to a value between an upper limit frequency of the transmission frequency pass band and a lower limit frequency of the reception frequency pass band.

4. The duplexer according to claim 3, wherein the transmission band filter includes at least one inductor for enhancing attenuation characteristics on a higher frequency side than the transmission frequency pass band.

5. The duplexer according to claim 4, wherein the inductor is connected in parallel with some of the first series elements.

6. The duplexer according to claim 5, wherein one end of the inductor is connected to the transmission port.

7. The duplexer according to claim 3, wherein the reception band filter includes at least one capacitor for enhancing attenuation characteristics on a lower frequency side than the reception frequency pass band.

8. The duplexer according to claim 7, wherein the capacitor is connected in parallel with some of the second series elements.

9. The duplexer according to claim 8, wherein one end of the capacitor is connected to the reception port.

10. A duplexer comprising:
a transmission port, reception port, and transmission/reception port;
a transmission band filter which is connected between the transmission port and transmission/reception port and which includes a first circuit including a first series element constituted of a film bulk acoustic resonator and a first shunt element constituted of a film bulk acoustic resonator and which has a transmission frequency pass band; and
a reception band filter which is connected between the reception port and transmission/reception port and which includes a second circuit including a second series element constituted of a film bulk acoustic resonator and a second shunt element constituted of a film bulk acoustic resonator and which has a reception frequency pass band,
wherein the transmission port, reception port, transmission/reception port, transmission band filter, and reception band filter are formed using a common substrate, the substrate is a ceramic substrate and includes a patterned conductive film in at least an inner part, and a phase matching circuit formed using the patterned conductive film and connected to the port for transmission/reception, transmission band filter and reception band filter is disposed on the substrate.

11. The duplexer according to claim 10, wherein the ceramic substrate is made of a laminate including a plurality of ceramic sheets and the patterned conductive film.

12. The duplexer according to claim 10, wherein the ceramic substrate contains a mixture of ceramic and glass, and a sintering temperature of the ceramic substrate is in a range of 800 to 950° C.

13. The duplexer according to claim 10, wherein the ceramic substrate contains a mixture of alumina and borosilicate-based glass, a mixture of forsterite and borate-based glass, or tin barium borate.

14. The duplexer according to claim 10, wherein the patterned conductive film is made of silver or copper.

15. The duplexer according to claim 10, wherein the phase matching circuit is formed using a conductive film having a line pattern shape whose length extending to a connection end to the transmission band filter from that to the port for transmission/reception and whose length extending to a connection end to the reception band filter from that to the port for transmission/reception are set to required values.

16. The duplexer according to claim 10, wherein the phase matching circuit is formed using at least one of a transmission side portion including an inductor and capacitor disposed between the port for transmission/reception and the transmission band filter, and a reception side portion including an inductor and capacitor disposed between the port for transmission/reception and the reception band filter.

17. The duplexer according to claim 10, wherein the transmission band filter or the reception band filter contains a passive element formed on the substrate using the patterned conductive film.

18. The duplexer according to claim 17, wherein the passive element is an inductor connected in series with the first shunt element of the first circuit or the second shunt element of the second circuit, an inductor connected in parallel with the first series element of the first circuit, or a capacitor connected in parallel with the second series element of the second circuit.

19. A filter which is used as the transmission band filter or the reception band filter in the duplexer according to claim 17.

20. A filter connected between a first port and a second port,
the filter comprising: a series element constituted of a film bulk acoustic resonator; and a shunt element constituted of a film bulk acoustic resonator, the first and second ports, the series element, and the shunt element being formed using a common substrate, the substrate being a ceramic substrate including a patterned conductive film in at least an inner part, the substrate comprising a passive element formed using the patterned conductive film and connected to the series element or the shunt element.

21. The filter according to claim 20, wherein the ceramic substrate is made of a laminate including a plurality of ceramic sheets and the patterned conductive film.

22. The filter according to claim 20, wherein the ceramic substrate contains a mixture of ceramic and glass, and a sintering temperature of the ceramic substrate is in a range of 800 to 950° C.

23. The filter according to claim 20, wherein the ceramic substrate contains a mixture of alumina and borosilicate-based glass, a mixture of forsterite and borate-based glass, or tin barium borate.

24. The filter according to claim 20, wherein the patterned conductive film is made of silver or copper.

25. The filter according to claim 20, wherein the passive element is an inductor connected in series with the shunt element, an inductor connected in parallel with the series element, or a capacitor connected in parallel with the series element.

* * * * *